United States Patent
Fish et al.

(10) Patent No.: US 8,020,398 B2
(45) Date of Patent: Sep. 20, 2011

(54) FLUID DELIVERY MECHANISM FOR VACUUM WAFER PROCESSING SYSTEM

(75) Inventors: Roger B. Fish, Bedford, MA (US); Robert J. Mitchell, Winchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 540 days.

(21) Appl. No.: 12/243,983

(22) Filed: Oct. 2, 2008

(65) Prior Publication Data
US 2010/0084579 A1    Apr. 8, 2010

(51) Int. Cl.
*C23F 1/00* (2006.01)
(52) U.S. Cl. .................. 62/259.2; 156/345.27; 118/724; 279/128; 361/699
(58) Field of Classification Search .................. 62/259.2; 156/345.27; 118/724; 279/128; 361/699
See application file for complete search history.

(56) References Cited

U.S. PATENT DOCUMENTS

| 7,363,082 B2* | 4/2008 | Ransbury et al. ............... 607/36 |
| 2005/0085077 A1* | 4/2005 | Ogawa et al. ................. 438/689 |

* cited by examiner

*Primary Examiner* — Cheryl J Tyler
*Assistant Examiner* — Jonathan Bradford

(57) ABSTRACT

The fluid delivery mechanism of the present disclosure provides a solution for use in a single axis of motion that allows the connection of one or more fluid flow paths over a wide range of temperatures into a vacuum environment. The mechanism does not employ flexible tubing that is prone to fatigue, especially at very low temperatures. In one embodiment, a tube is axially moved within a sealed piston to allow for fluid delivery. In a second embodiment, bellows are used to provide the required functionality. In another embodiment, it is possible to achieve movement in two or more axis of motion by utilizing two or more appropriately configured mechanisms.

14 Claims, 18 Drawing Sheets

FLUID DELIVERY MECHANISM FOR VACUUM WAFER PROCESSING SYSTEM

BACKGROUND OF THE INVENTION

Ion implanters are commonly used in the production of semiconductor wafers. An ion source is used to create an ion beam, which is then directed toward the wafer. As the ions strike the wafer, they dope a particular region of the wafer. The configuration of doped regions defines their functionality, and through the use of conductive interconnects, these wafers can be transformed into complex circuits.

A block diagram of a representative ion implanter 100 is shown in FIG. 1. An ion source 110 generates ions of a desired species. In some embodiments, these species are atomic ions, which may be best suited for high implant energies. In other embodiments, these species are molecular ions, which may be better suited for low implant energies. These ions are formed into a beam, which then passes through a source filter 120. The source filter is preferably located near the ion source. The ions within the beam are accelerated/decelerated in column 130 to the desired energy level. A mass analyzer magnet 140, having an aperture 145, is used to remove unwanted components from the ion beam, resulting in an ion beam 150 having the desired energy and mass characteristics passing through resolving aperture 145.

In certain embodiments, the ion beam 150 is a spot beam. In this scenario, the ion beam passes through a scanner 160, which can be either an electrostatic or magnetic scanner, which deflects the ion beam 150 to produce a scanned beam 155-157. In certain embodiments, the scanner 160 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to leave the scanned beam at every position for nearly the same amount of time. Deviations from the triangle are used to make the beam uniform. The resultant electric field causes the ion beam to diverge as shown in FIG. 1.

In an alternate embodiment, the ion beam 150 is a ribbon beam. In such an embodiment, there is no need for a scanner, so the ribbon beam is already properly shaped.

An angle corrector 170 is adapted to deflect the divergent ion beamlets 155-157 into a set of beamlets having substantially parallel trajectories. Preferably, the angle corrector 170 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 170, the scanned beam is targeted toward the workpiece 175. The workpiece is attached to a workpiece support. The workpiece support provides a variety of degrees of movement.

The workpiece support is used to both hold the wafer in position, and to orient the wafer so as to be properly implanted by the ion beam. To effectively hold the wafer in place, most workpiece supports typically use a circular surface on which the workpiece rests, known as a platen. Often, the platen uses electrostatic force to hold the workpiece in position. By creating a strong electrostatic force on the platen, also known as the electrostatic chuck, the workpiece or wafer can be held in place without any mechanical fastening devices. This minimizes contamination and also improves cycle time, since the wafer does not need to be unfastened after it has been implanted. These chucks typically use one of two types of force to hold the wafer in place: coulombic or Johnson-Rahbeck force.

The workpiece support typically is capable of moving the workpiece in one or more directions. For example, in ion implantation, the ion beam is typically a scanned or ribbon beam, having a width much greater than its height. Assume that the width of the beam is defined as the x axis, the height of the beam is defined as the y axis, and the path of travel of the beam is defined as the z axis. The width of the beam is typically wider than the workpiece, such that the workpiece does not have to be moved in the x direction. However, it is common to move the workpiece along the y axis to expose the entire workpiece to the beam.

In some applications, it is necessary to pass fluids, in the form of gas and/or liquid into the vacuum environment. For example, in some embodiments, the platen is maintained at a constant, or nearly constant temperature, by running fluid through conduits located within the platen. Depending on the type of ion implantation being performed, this fluid may be for the purpose of heating the workpiece or cooling the workpiece.

This entire system is typically maintained at very low pressure, such as less than 100 mTorr. Although the pressure is greater than 0, this environment is commonly referred to as a vacuum. The task to delivering fluids to a vacuum environment is further complicated by several factors. First, in many instances, the fluid must be delivered to a terminus or endpoint that is not stationary. As described above, it is typical for the workpiece support to move along the y axis to irradiate the entire surface of the workpiece. The movement of the terminus typically necessitates the use of flexible tubing or some other moveable conduit. Making this endeavor even more difficult, at times the fluids that are being delivered are at very low temperatures, such as cryogenic temperatures. In extremely low temperatures, the flexible tubing is susceptible to fatigue due to the bending stresses from the cyclic movement, and therefore cannot be used. Alternative coupling mechanisms, such as rotary or linear sliding seals, are difficult to produce without leakage. They are also typically physically quite large and hence difficult to package near the moving workpiece.

As an example, for cryogenic ion implantation, it is necessary to maintain the temperature of wafer at very low temperatures, despite the fact that constant ion bombardment tends to increase its temperature. One method of achieving this is to pass low temperature fluids through conduits in the platen. By keeping the platen extremely cold, the wafer, by virtue of its contact with the platen, preserves its low operating temperature. However, as explained above, the wafer (and therefore the platen) is typically moved axially through the ion beam so as to insure that the entire wafer is exposed to the ion beam. Reliably delivering cryogenic fluid to a moving platen in a vacuum environment is extremely difficult.

These constraints make it very different to provide a fluid delivery system to a workpiece support, such as a platen, in a vacuum wafer processing system. Therefore, a system that allows the delivery of fluid, such as extremely cold fluid, into a vacuum environment would be extremely beneficial, especially if delivered to a non-stationary terminus.

SUMMARY OF THE INVENTION

The problems of the prior art are overcome by the fluid delivery mechanism described in the present disclosure. In some embodiments, this mechanism provides a solution for use in a single axis of motion that allows the connection of one or more fluid flow paths over a wide range of temperatures into a vacuum environment. The mechanism does not employ flexible tubing that is prone to fatigue, especially at very low temperatures. In one particular embodiment, a tube is axially moved within a sealed piston to allow for fluid delivery. In a second particular embodiment, bellows are used to provide the required functionality. In another embodiment, it is possible to achieve movement in two or three axis of motion by utilizing two or more mechanisms configured appropriately.

DETAILED DESCRIPTION OF THE INVENTION

As described above, delivering fluids, particularly extremely cold fluids, into a vacuum environment is very difficult. This is further complicated when the destination for that delivered fluid is not stationary. In one embodiment, the present mechanism provides a delivery system that allows movement along one axis of motion. This allows fluids to be delivered to devices or termini that are being moved along one axis of motion.

One such application of this device is the process chamber of an ion implantation system. In certain embodiments, the wafer must be maintained within a certain temperature range. To accomplish this, the platen, which holds the wafer, is cooled (or heated) by a fluid being passed through conduits located within it. For example, in ion implantations that occur at extremely low temperatures, it is essential to continuously cool the platen, since the ions being directed at the wafer tend to heat the wafer and, indirectly, the platen. To maintain the temperature of the wafer within the desired range, it is necessary to pass cryogenic fluids to and from the platen. These fluids may be gasses, such as helium, nitrogen or CDA (clean dry air), or may be liquids, such as liquid nitrogen, Flourinert or other low temperature coolants.

As stated above, in many applications, the wafer is scanned by an ion beam. This beam is very narrow and therefore, it is necessary to move the wafer to insure that all portions of the wafer are exposed to the beam. This is typically done by moving the platen, to which the wafer is attached, in a linear manner to subject different parts of the wafer to the beam. Therefore, to cool or heat the platen as described above, it is essential that the device used to carry the fluid to the platen be capable of adapting to the varying position of the platen.

Figure 1:
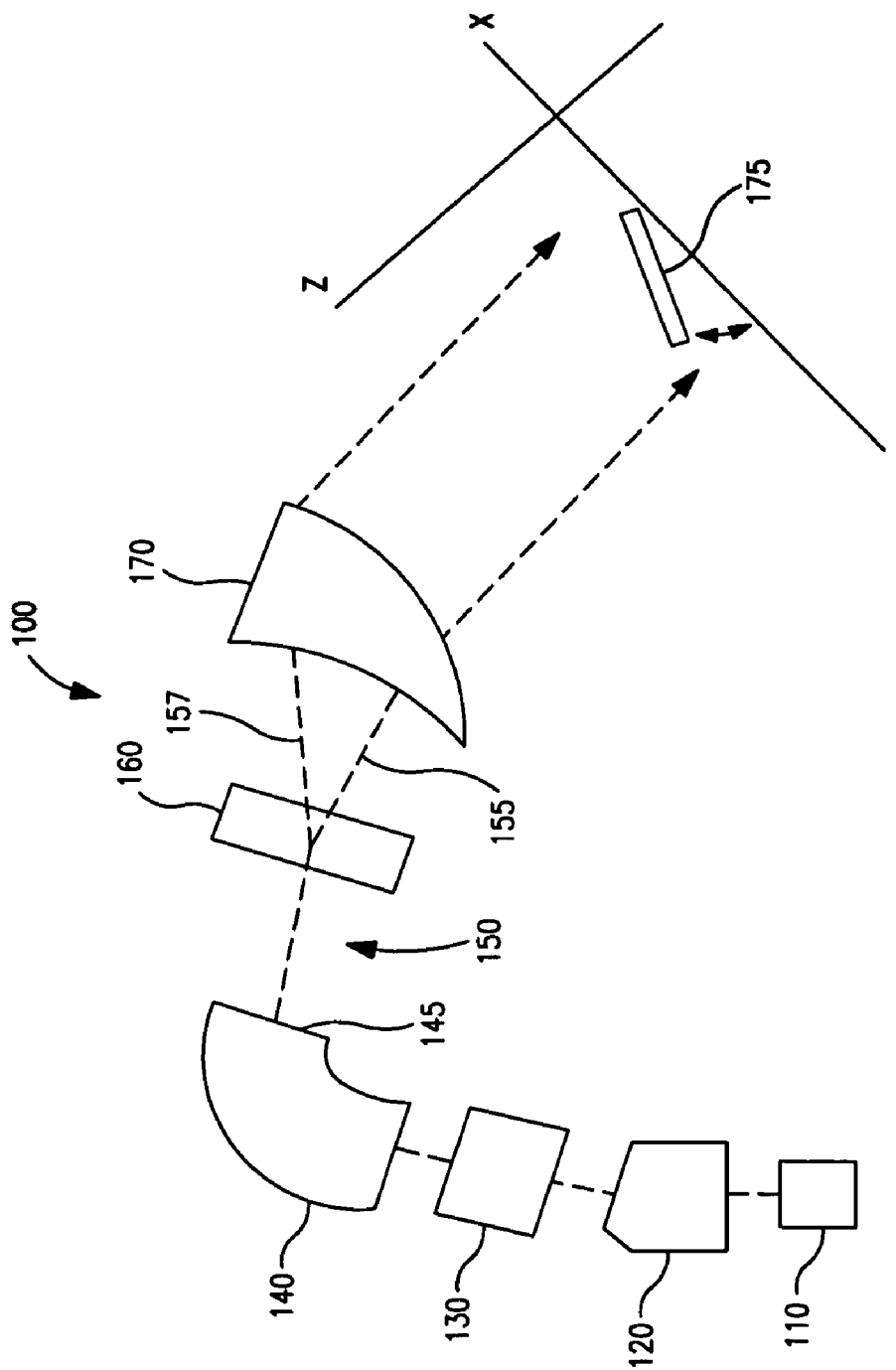
FIG. 1 represents a traditional ion implanter.
Figure 2:
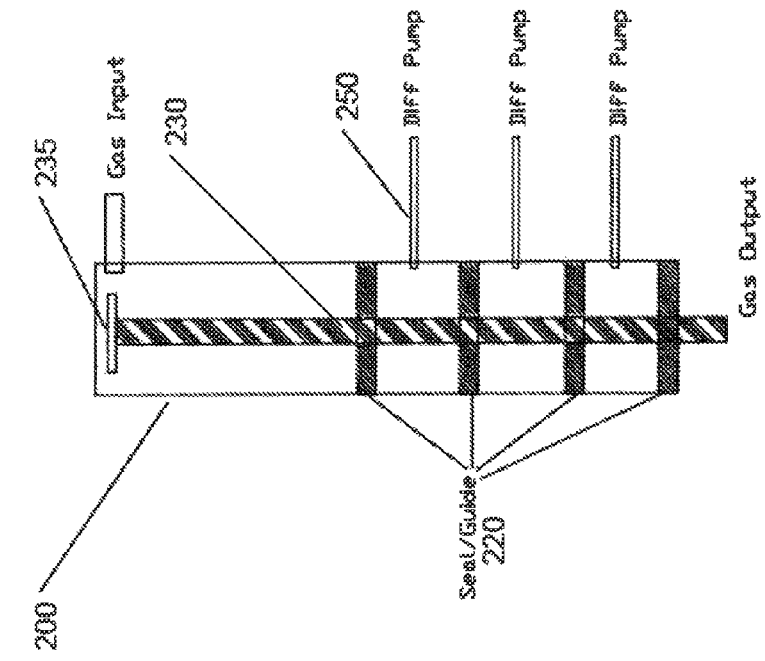
FIG. 2 represents a linear fluid sliding seal having a single fluid path.
Figure 2:
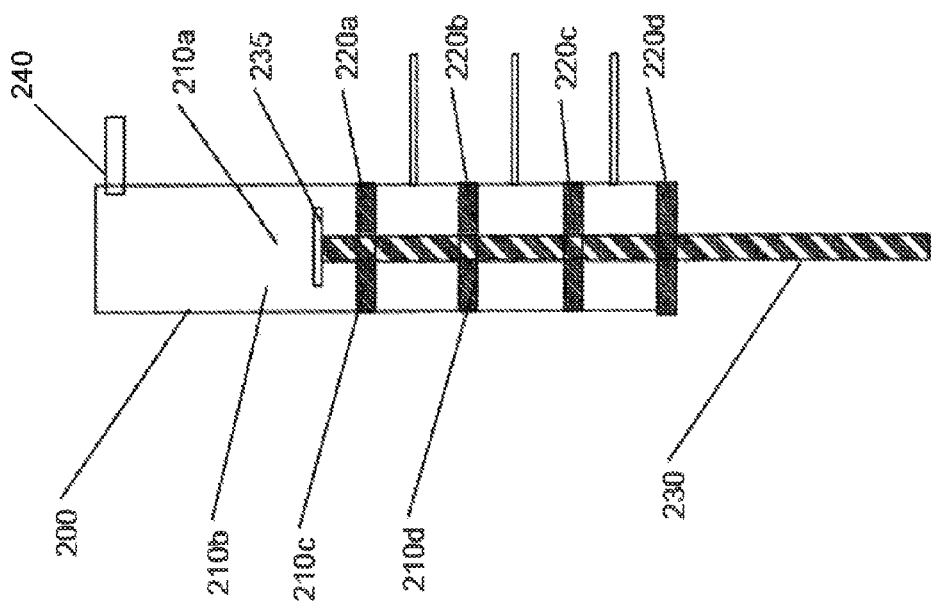

FIG. 2 shows one embodiment of the present device. The device comprises a column or cylinder 200, which is separated into one or more chambers 210 through the use of sealing elements 220. The column is preferably constructed of stainless steel, although other suitable materials may be used. The sealing elements, which are made from Teflon® or another suitable material, create seals that are nearly fluid and airtight. These sealing elements define adjacent chambers 210 within the column 200. Within the column or cylinder 200 is a tube 230, having a hollow center, which allows the passage of fluid. Each of the sealing elements 220 also has a hole, preferably in its center, through which the tube 230 passes. The interface between the sealing elements 220 and the tube 230 is also nearly fluid and air tight.

One end of the tube 230 exits cylinder 200, while the opposite end remains within the tube, and preferably is confined within one chamber 210a. To insure that the tube 230 remains within a single compartment, the proximate end of the tube is preferably made wider, such as through the use of a flange 235, so that it cannot pass through the opening in the sealing element 220. Thus, the length of travel of the tube 230 is confined to the length of the chamber 210a, where the wider end of tube 230 is located. While a flange is illustrated in this figure, those skilled in the art will appreciate that other mechanisms can be used to insure that the proximate end of central tube 230 remains within chamber 210a. Those mechanisms are within the scope of this disclosure.

As noted above, the column 200 can be separated into any number of chambers 210, each separated and defined by sealing elements 220. The open end of the column 200 is preferably closed with a sealing element 220d, similar to those used to separate the chambers.

In one embodiment, the fluid (either gas or liquid) enters the column 200 via fluid inlet 240. Since the tube 230 is hollow, the fluid passes from the compartment 210a, into the tube 230 and flows to the terminus. Since the sealing elements 220 provide nearly fluid and air tight barriers, a small amount of fluid may be introduced into the adjacent compartment. To address this, each compartment is in communication with a differential pump, which serves to lower the pressure of each compartment, relative to the one adjacent to it. Thus, the pressure within chamber 210b is lower than that within chamber 210a, but higher than that in chamber 210c. The pressure within each chamber is reduced as the chambers near the open end of the cylinder 200.

Often, the fluid introduced into compartment 210a is at or near normal atmospheric pressure. The environment outside of the column 200, and specifically on the exterior of sealing element 220d, is near vacuum pressure. Therefore, it may be beneficial to include a number of chambers 210b-d, which serve to reduce the differential pressure across sealing elements 220a-d. In other words, in the case where only one chamber is used, the differential pressure across with lone seal is equal to the difference in the pressure of the fluid in the chamber and the external vacuum. By utilizing four chambers, as shown in FIG. 2, the differential pressure across any sealing element is reduced by 75%. To achieve this, differential pumps are used to regulate the pressure within each chamber via inlets 250. In the column shown in FIG. 2, the pressure within each chamber decreases moving from top to bottom, as the pressure at the uppermost chamber is near atmospheric pressure, and the pressure below the bottommost chamber is near vacuum. While four chambers 210 are shown in FIG. 2, any number (either more or less) can be used, as required. For example, if sealing element 220d can provide a fluid and airtight seal, it is not necessary to provide any additional chambers 210 within cylinder 200.

Figure 3A:
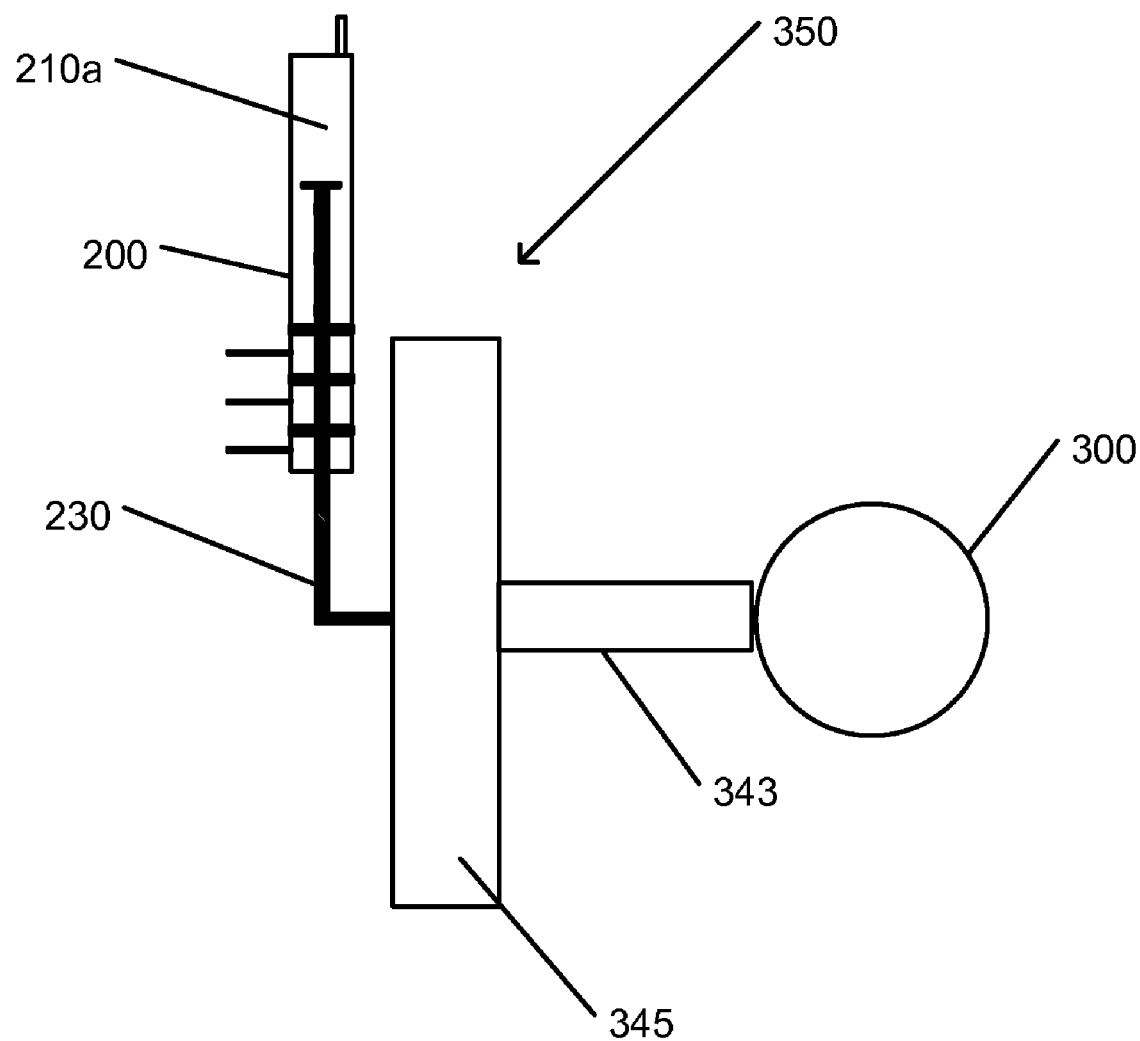
FIG. 3 represents the sliding seal of FIG. 2 as used when connected to a moving apparatus.
Figure 3B:
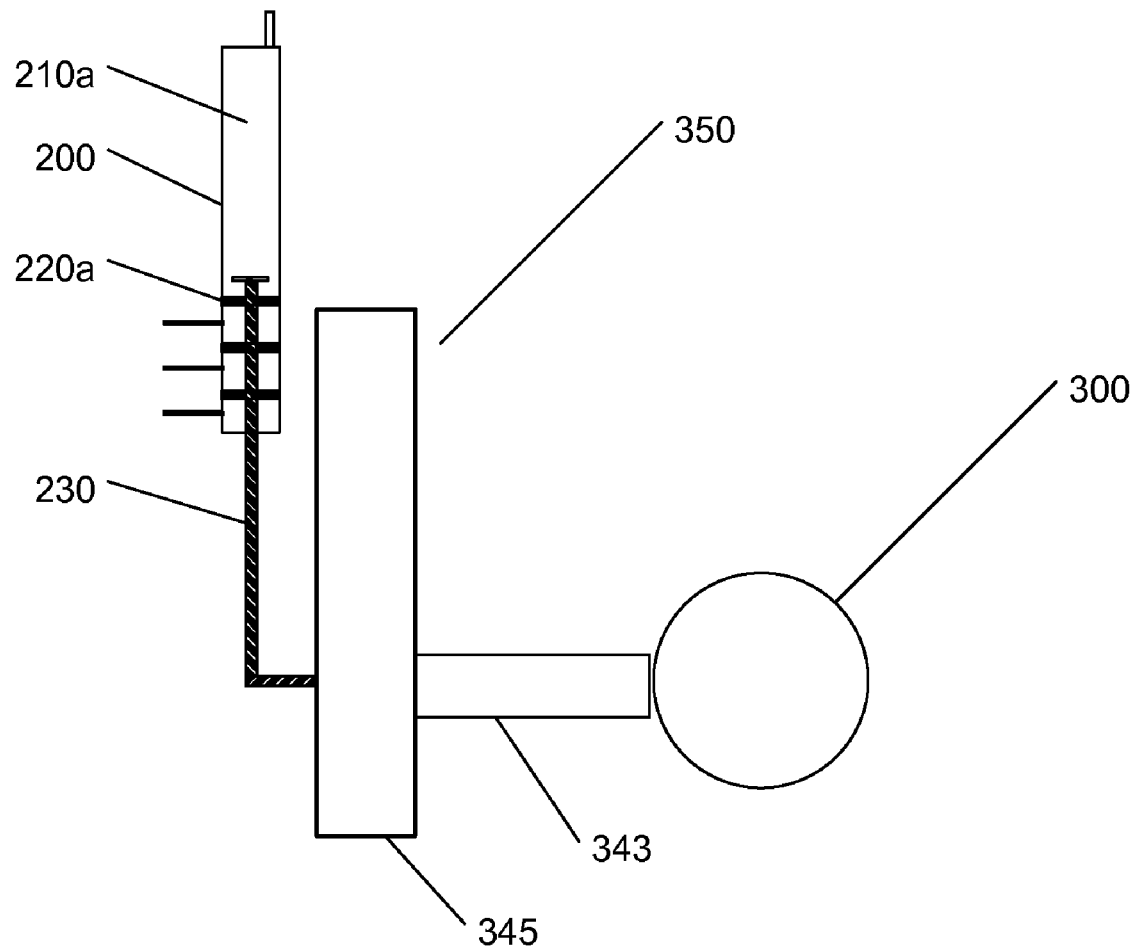
Figure 3C:
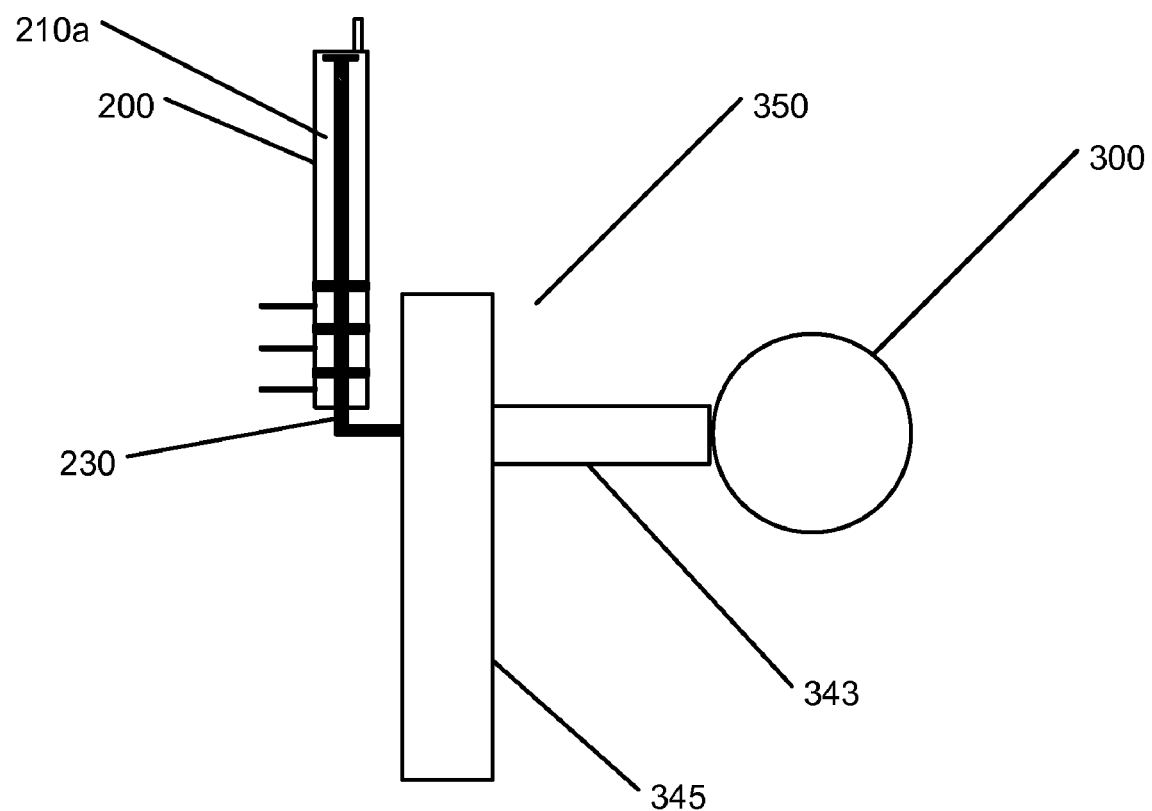

FIGS. 3a-c show the device of FIG. 2 as used with a terminus, such as a workpiece support 350 The workpiece support 350 includes a stationary portion 345 and a movable portion 343. At the distal end of the moveable portion 343 is the platen 300. As described earlier, the platen 300 is moved in the vertical direction in order that the ion beam can scan the entire attached wafer. To do this, the movable portion 343 of the workpiece support 350 moves up and down. The three figures illustrate 3 representative positions of the movable portion 343 and the platen 300. It should be obvious to one skilled in the art that the platen 300 moves in a continuous motion, and therefore there are an arbitrary number of positions for the platen 300. This figure simply attempts to describe the operation of the device by showing 3 distinct positions. In the FIG. 3a, the platen 300 is in the middle of its range of motion, or midrange position. Therefore, the tube 230 is partially extended from the cylinder 200. Thus, the proximate end of the tube 230 is located approximately in the middle of the chamber 210a. In FIG. 3b, the platen 300 has moved downward to its lowest point, and further away from the cylinder 200. This motion by the moveable portion 343 forces the tube 230 to extend further from the cylinder 200. In this position, the tube 230 is in its most extended position, as the wider end of the tube 230 is in contact, or nearly in contact with sealing element 220a. FIG. 3c shows the movable portion 343 and the platen at its highest point, where the tube 230 is in its least extended position. Thus, the wider proximate end of tube 230 is in contact, or nearly in contact with, the closed end of the cylinder 200. FIGS. 3b and 3c define the range of motion for the tube 230 and the platen 300. This length of this range of motion must be less than, or equal to, the height of the first chamber 210a. The length of chamber 210a may be much longer than the range of motion of the platen, if desired. The sole requirement is that its length must be at least the same as the required range of motion of the tube.

Although not shown in FIG. 3, tube 230 is preferably affixed to movable portion 343, such as through a weld, a screw type fitting or other attachment means. Conduits within the movable portion 343 lead from that point of attachment to the platen 300.

As described above, in certain embodiments, the platen 300 is cooled by passing a fluid through it. In such embodiments, there is a need for at least two fluid delivery paths; a first path to bring fluid to the platen 300, and a second path to serve as a return path for that delivered fluid.

Figure 4:
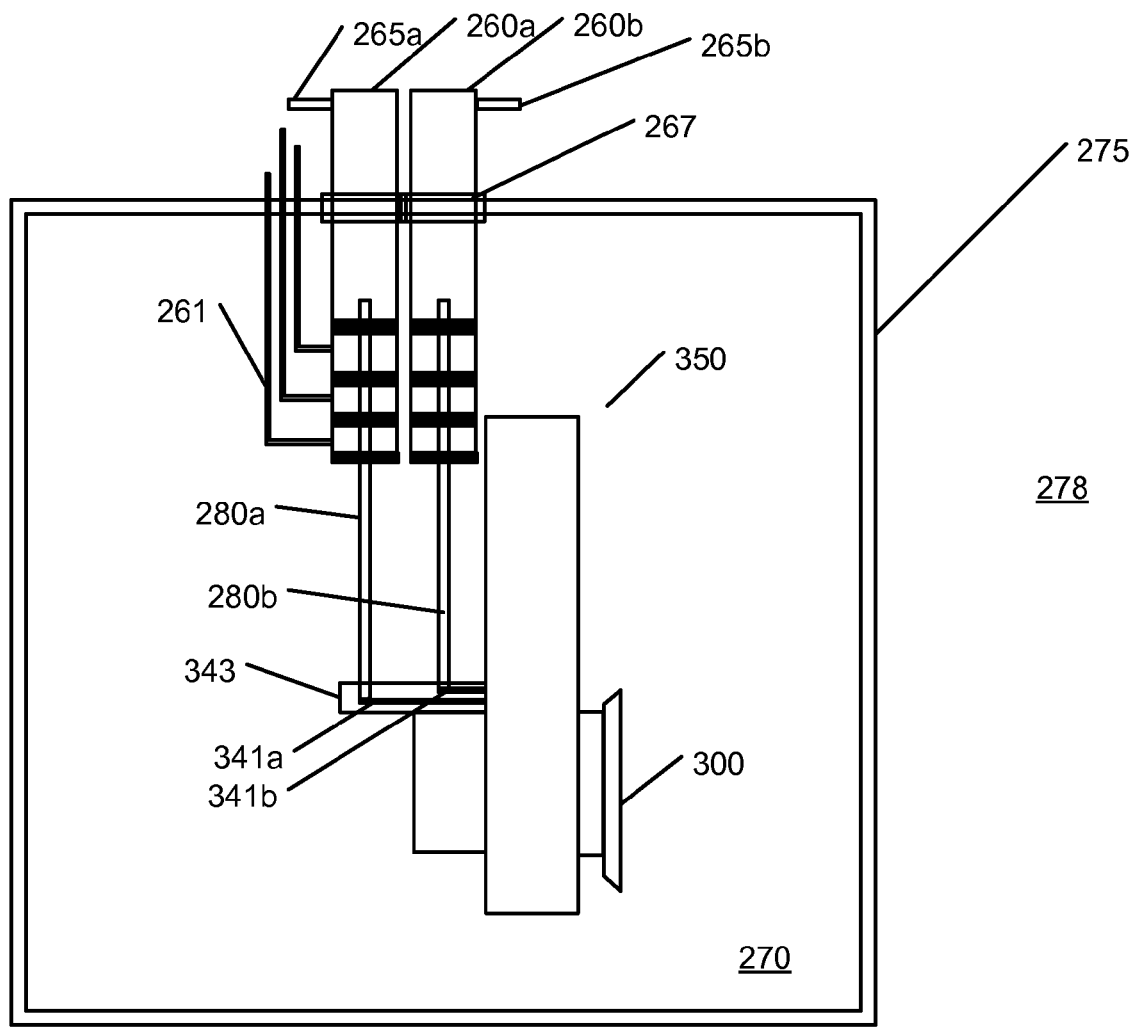
FIG. 4 represents the side view of a process chamber layout utilizing two of the sliding seals of FIG. 2.

FIG. 4 shows a side view of a process chamber layout. In this embodiment, two cylinders 260a, 260b are used, where one serves to deliver the fluid to the platen 300 and the other serves as the return path. The chamber 270, defined by wall 275, is kept at near vacuum pressure, while the exterior environment 278 is maintained at atmospheric pressure. Two devices, as described in conjunction with FIG. 2, are used to circulate fluid through the platen 300. In FIG. 4, these devices are shown with the tubes 280a, 280b in their most extended positions. The movable portion 343 and the platen 300 can move upwardly until the tubes 280 reaches the closed end of the cylinders 260. In this embodiment, the distal ends of the two tubes 280 are affixed to the movable portion 343 of the workpiece support 350. Within the movable portion, 2 conduits 341a, 341b are used to direct the paths of the fluid flow so as to contact the proper locations on the platen 300. Other methods of attaching the tubes to the workpiece support are well known and within the scope of this disclosure.

In operation, fluid enters the upper chamber of cylinder 260a via inlet 265a. This fluid passes through tube 280a and into the fluid conduits 341a in movable portion 343. The fluid then passes through the platen 300 and returns via fluid conduits 341b to tube 280b. The fluid travels up the tube 280b and into the upper chamber of cylinder 260b. The fluid then exits via outlet 265b. The source and terminus of the fluid path is kept outside the vacuum environment. In some embodiments, the fluid is recirculated and is pumped from the outlet 265b back to the inlet 265a. In some embodiments, the fluid is conditioned, such as cooled, before being reused.

Cylinders 260a, 260b are partially in the vacuum environment 270, and partially outside of the vacuum. To maintain the integrity of the vacuum environment 270, sealing elements 267 are used to provide a fluid and airtight seal between the wall 275 and the cylinders 260a, 260b. In FIG. 4, conduits 261 are used to attach the differential pumps to the various chambers within the cylinders 260a, 260b. Preferably the differential pumps are kept in normal atmospheric environment 278, and thus, seals are also used to maintain the integrity of the vacuum between the conduits 261 and the wall 275.

Figures 5A, 5B:
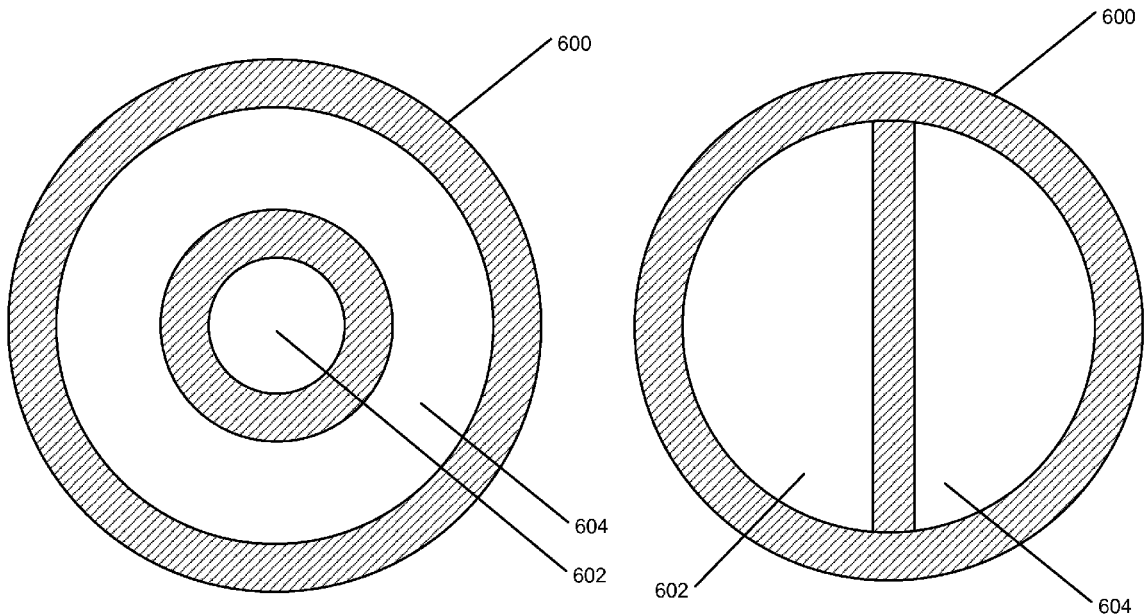
FIGS. 5a-5b represent cross-sectional views of tubes having multiple conduits.
Figure 6A:
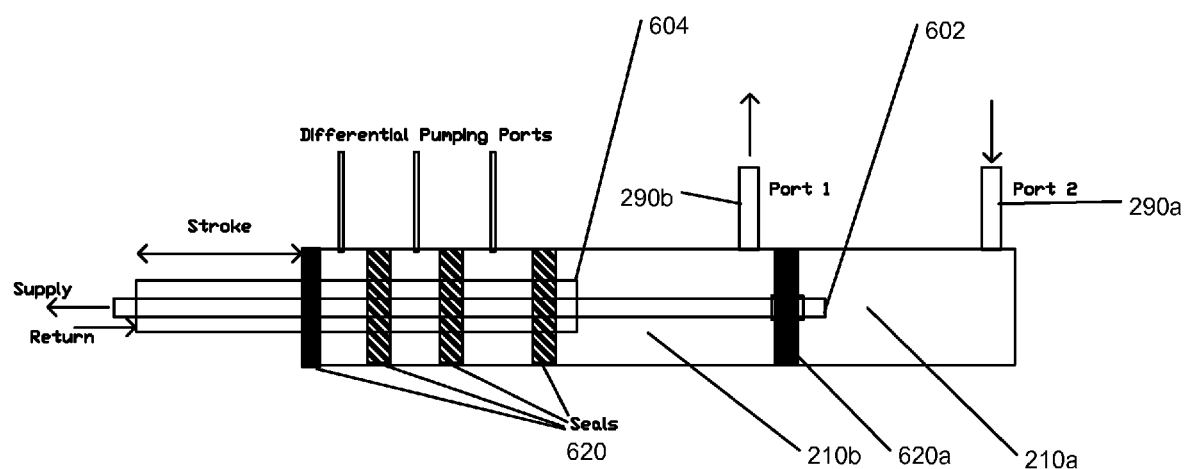
FIGS. 6a-6c represents embodiments of a linear fluid sliding seal having a plurality of fluid conduits, using the tubes shown in FIGS. 5a and 5b.
Figure 6B:
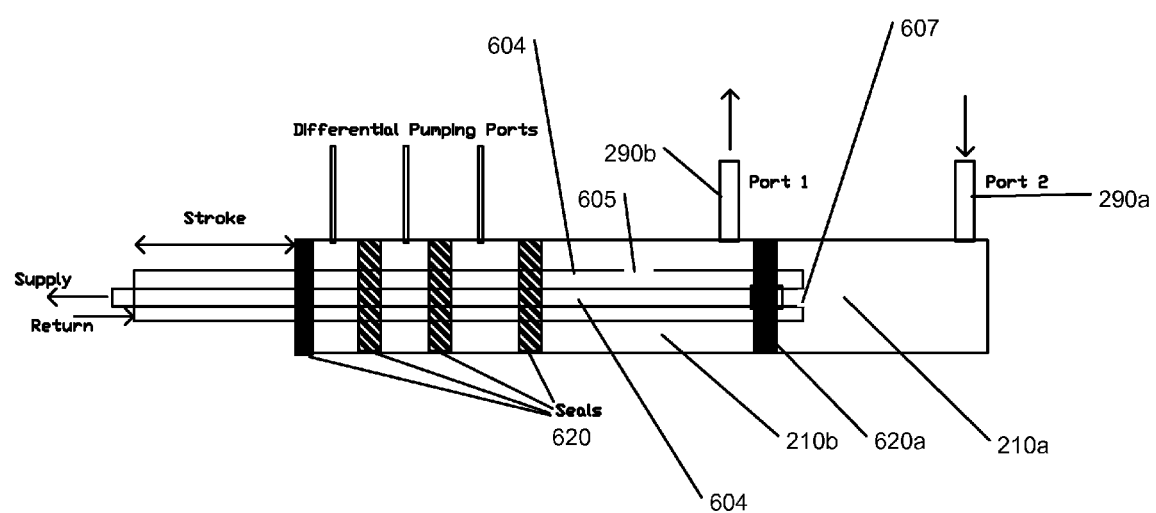

As explained above, in many embodiments, it is typical and necessary to have two separate fluid paths (as shown in FIG. 4). FIG. 5a shows the cross section of a single tube that accomplishes this. In this embodiment, the central tube 600, rather than having a single conduit, has a plurality of conduits 602, 604. This can be accomplished using numerous techniques. In one embodiment, shown in FIG. 5a, a coaxial tube 600 is used, which has an inner conduit 602, and an outer conduit 604 that surrounds the inner conduit 602. These conduits can be dimensioned such that they are of equal cross-sectional area, or can be dimensioned in any other suitable ratio. In one embodiment, shown in FIG. 6a, these conduits terminate in different chambers. The inner conduit 602 terminates in the rightmost chamber 210a, while the outer conduit 604 terminates in the adjacent chamber 210b. These two chambers 210a, 210b are preferably of equal length, and the inner conduit 602 extends beyond the outer conduit 604 by this length, such that each conduit terminates in the same relative position within its respective chamber. Inlet 290a is used to supply fluid to the mechanism, while outlet 290b is used to remove the return fluid from chamber 210b. Note that sealing element 620a is different from the remaining sealing elements in that it has an opening to accommodate only the inner conduit 602. Alternatively, the outer conduit 604 may extend the length of the tube and be sealed at the far end, as shown in FIG. 6b. In this embodiment, the outer conduit 604 may contain an opening 605 along its circumference in the second chamber 210b. The inner conduit 602 is in communication with the chamber 210a through an opening 607 on the proximate end of the tube 600. In this embodiment, all sealing elements 620 are identical in size.

Figure 6C:
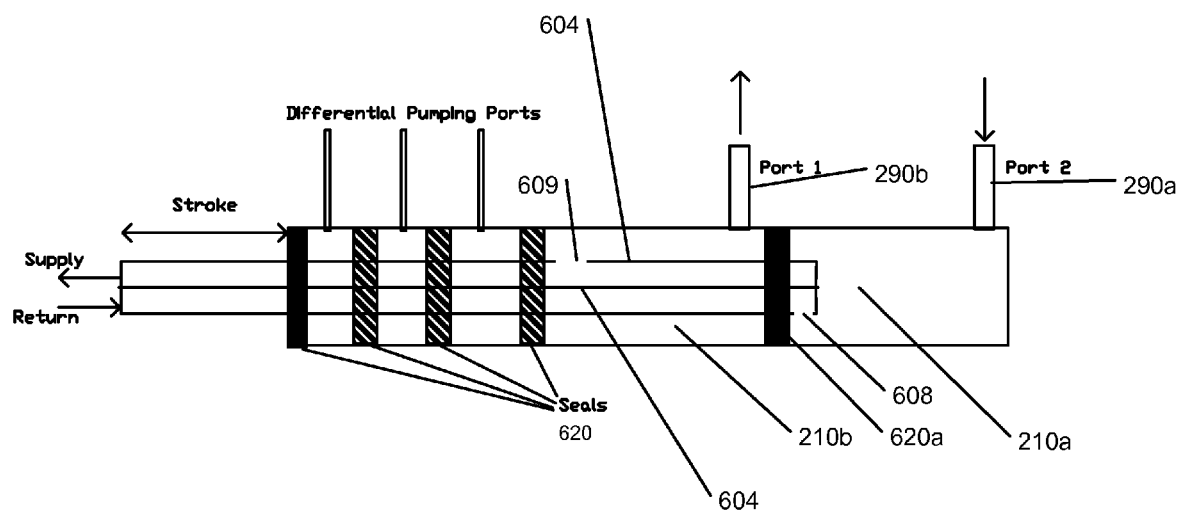

In this embodiment, the inner conduit 602 is used to provide fluid to the destination, such as a platen, while the outer conduit 604 is used as the return path. Those skilled in the art will appreciate that the conduits can be employed in other ways. While FIG. 5a shows coaxial conduits, the disclosure is not limited to this embodiment. For example, the conduits can be disposed adjacent to one another in the tube as shown in FIG. 5b. FIG. 6c shows an embodiment using the tube shown in FIG. 5b. In this figure, an opening 608 exists in one side of the tube 600 in the first chamber 210a for allowing fluid to enter the tube 600 and a second opening 609 exists on the opposite side of the tube 600 in the second chamber 210b to serve as the fluid outlet. As described above, fluid enters and exits the cylinder through inlet 290a and outlet 290b, respectively.

While the tubes shown in FIGS. 5a and 5b illustrate embodiments with 2 fluid conduits, other embodiments are envisioned. For example, an arbitrary number of coaxial conduits can be employed in the tube of FIG. 5a. Similarly, the tube shown in FIG. 5b can be divided into as many conduits as are desired.

In all embodiments, multiple sealing elements 620 and compartments are used to alleviate the pressure differential experienced at the sealing elements, and to accommodate the fact that each sealing element is not perfectly airtight.

Figure 7:
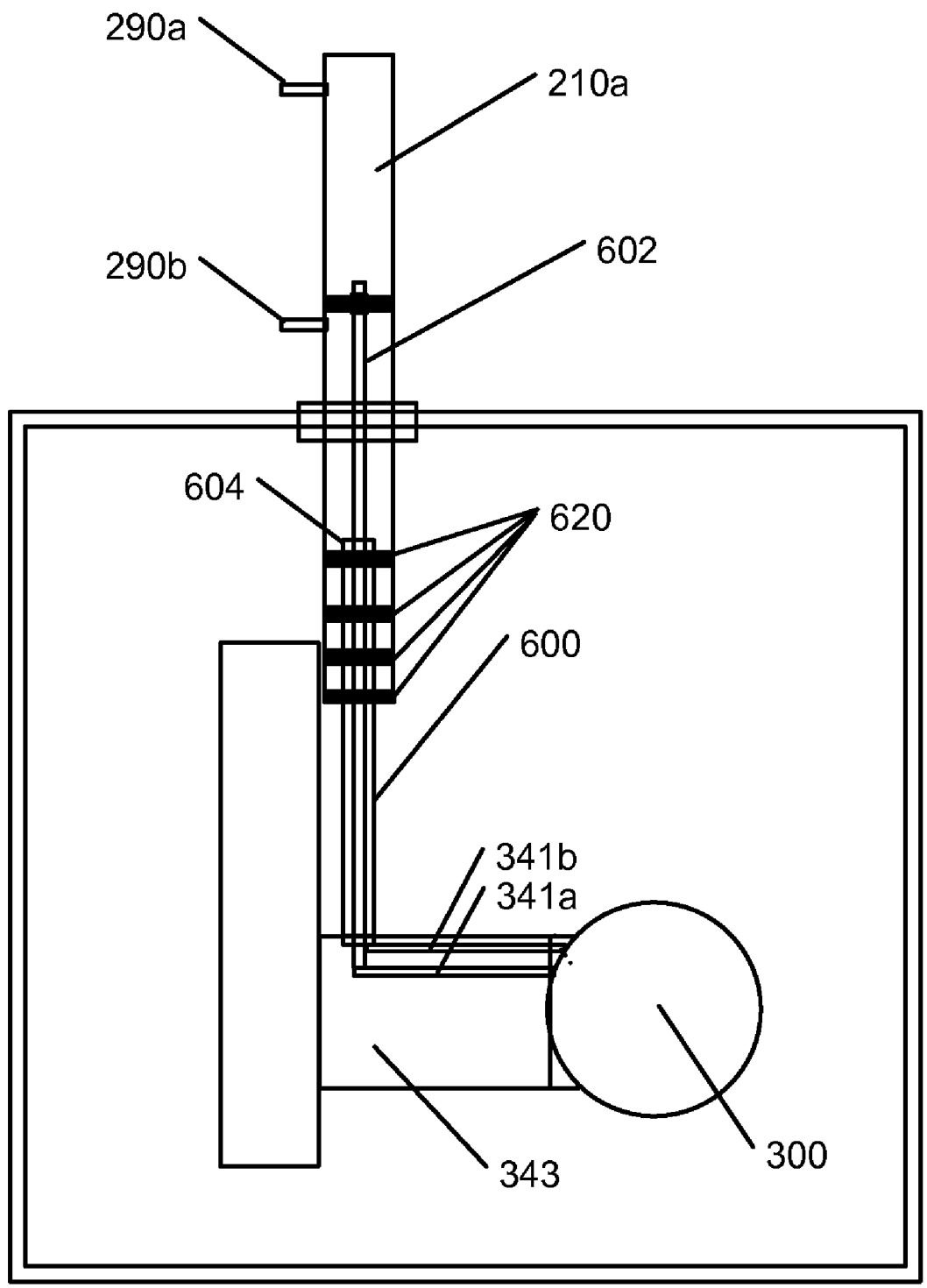
FIG. 7 represents the side view of a process chamber layout utilizing embodiments of the sliding seals shown in FIGS. 6a-6c.

FIG. 7 shows a front view of a process chamber layout that utilizes the tube having multiple conduits as shown in FIGS. 5 and 6. In this embodiment, fluid enters chamber 210a through inlet 290a. The fluid travels through tube 600, specifically the inner conduit 602 of tube 600, and is affixed to the movable portion 343 of workpiece support 350. As explained above, internal conduit 341a passes the fluid from the tube attachment point to the platen 300. After the fluid circulates through the platen 300, it returns through a second internal conduit 341b to the attachment point. The fluid then passes through the outer conduit 604 in tube 600, and exits the cylinder via outlet 290b. As described earlier, the sealing elements 620b-e serve to separate the cylinder into chambers, where each chamber is maintained at a lower pressure than the adjacent chamber.

Other embodiments other than those disclosed in FIGS. 2-7 can also be employed to create the fluid delivery mechanism.

Figure 8A:
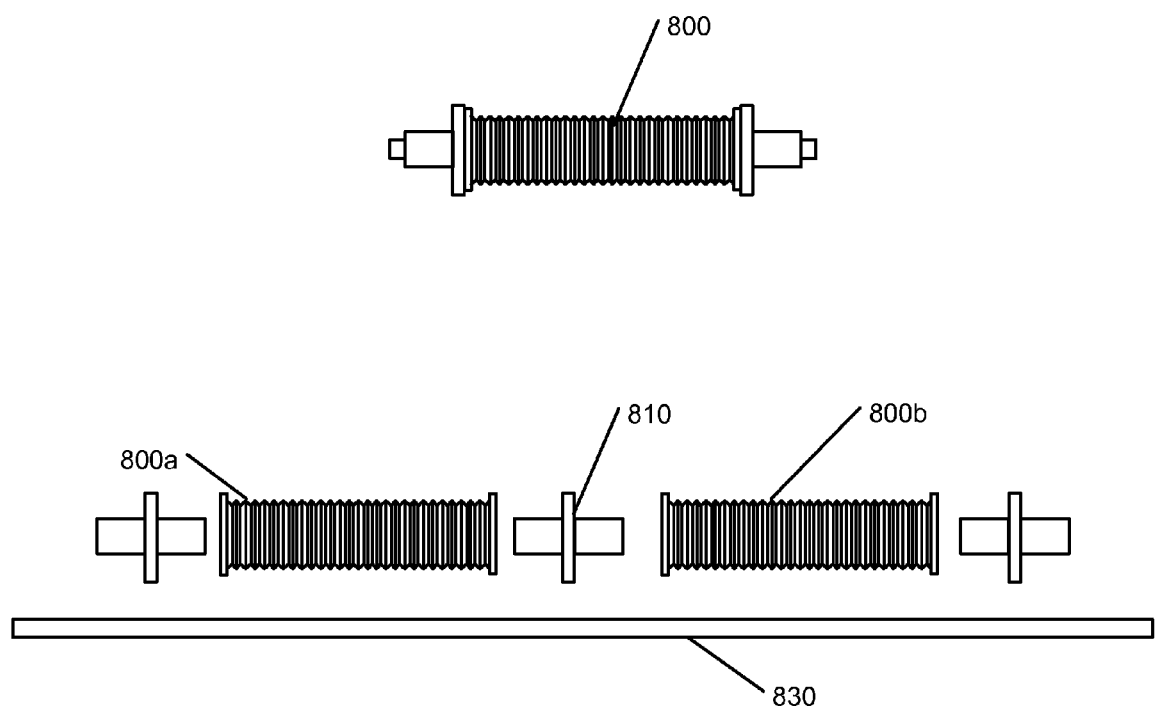
FIG. 8a-c show the various elements used in a second embodiment.

FIG. 8a shows the various components of a bellows mechanism. The bellows 800 is compressible unit, preferably made of metal such as stainless steel, Inconel® or Monel®, which can expand and contract within a specified range. The bellows 800 attach to the coupler 810 and form a fluid and airtight seal. Couplers 810 are used to link together a number of bellows to create a longer structure. One end of a bellows 800a attaches to the coupler 810, and the end of a second bellows 800b attaches to the opposite side of the coupler 810. An arbitrary number of bellows 800 can be joined together using couplers 810.

Figure 8B:
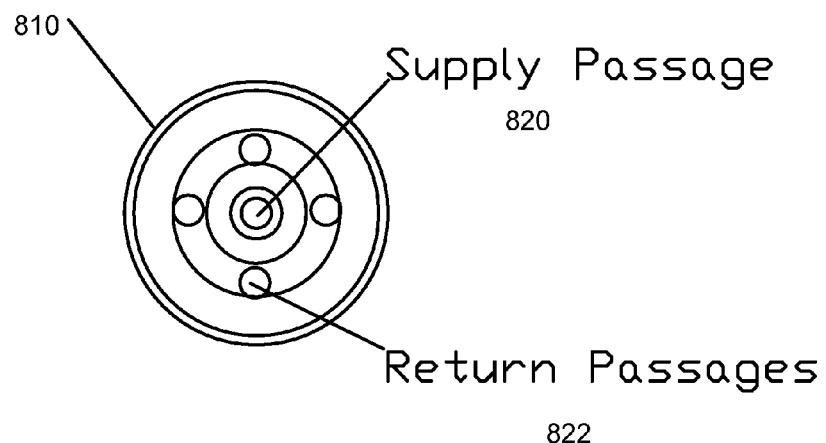

A side view of the coupler 810 is shown in FIG. 8b. Typically, the coupler 810 has a central opening or passage 820, adapted to allow a tube 830 to pass through it. This tube 830 is fitted into the passage 820 so as to create a fluid and airtight seal. In certain embodiments, the coupler 810 also has a number of additional openings or passages 822. These passages 822 are preferably in communication with the interior volume 825 of the bellows 810. Thus, when two or more bellows 800 are joined together using couplers, the interior volume 825 of all of the bellows is in communication, due to the presence of the additional openings 822 on all of the couplers.

Figure 8C:
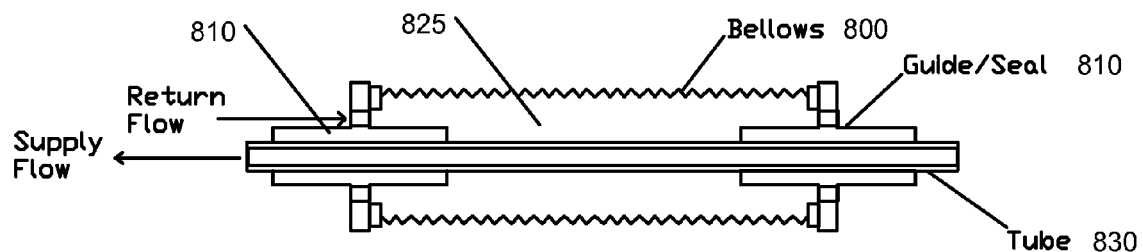

FIG. 8c shows a cross section of a bellows 800 with two couplers 810 and a tube 830. In one embodiment, the fluid is supplied via tube 830 from its source to a terminus. The return path for the fluid is via the additional passages 822 in the coupler 810, so that the interior volume of the bellows is filled with fluid returning from the terminus.

Figure 9A:
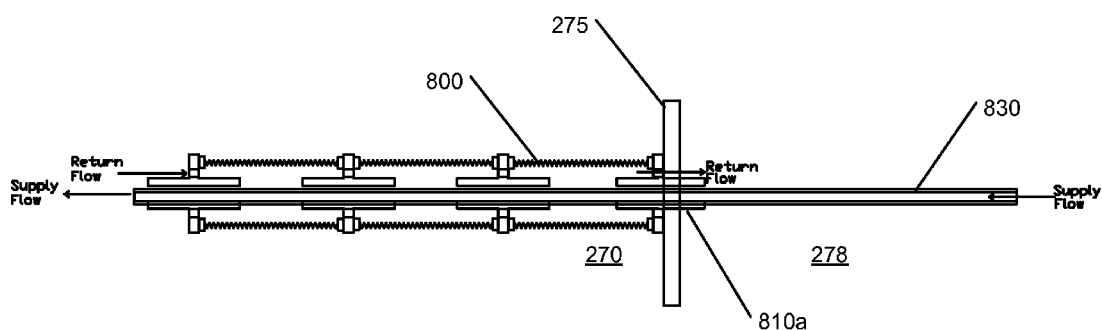
FIG. 9 shows the operation of an embodiment utilizing bellows.
Figure 9B:
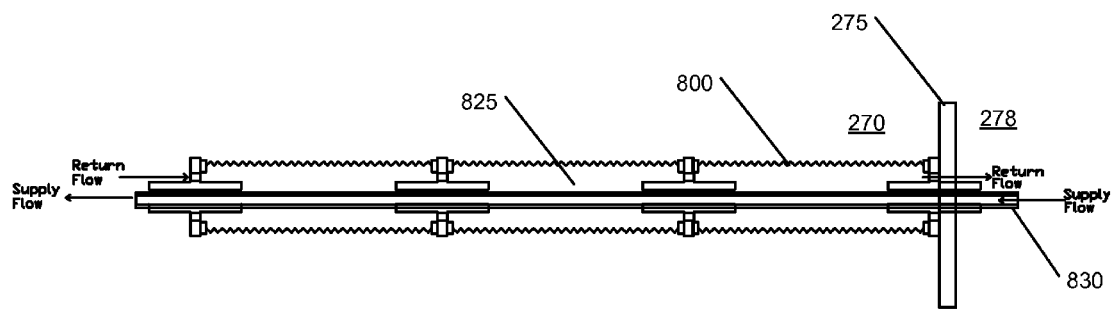

The bellows configuration can be used to supply fluid to a movable terminus within the vacuum environment, as shown in FIGS. 9a and 9b. In one embodiment, the fluid is supplied in the non-pressurized environment 278. The tube 830 and a portion of coupler 810a pass through the wall 275 that defines the vacuum environment 270. Sealing elements are used to insure a fluid and airtight seal between the coupler 810 and the wall 275. The fluid passes through the tube 830 and into the vacuum environment 270, where it eventually reaches the workpiece support (not shown). As the workpiece moves further from the wall 275, the tube 830 is pulled into the vacuum environment 270, as best shown in FIG. 9b. As the workpiece support moves toward the wall 275, the tube 830 extends further into the non-pressurized environment 278, as shown in FIG. 9a. The coupler located near the distal end of the tube 830 is also affixed to the workpiece support, and therefore tracks the movements of the tube 830. However, since bellows 800 terminate within the vacuum environment 270, the bellows are forced to extend and compress as the workpiece support (not shown) moves relative to the wall 275. FIG. 9a shows the bellows maximally compressed, while FIG. 9b shows the bellows maximally extended. As described above, the return path for the fluid is via the interior volume 825 of the bellows 800. The fluid is then passed through the wall 275 either via the coupler 810, or a separate conduit in the wall itself.

Figure 10:
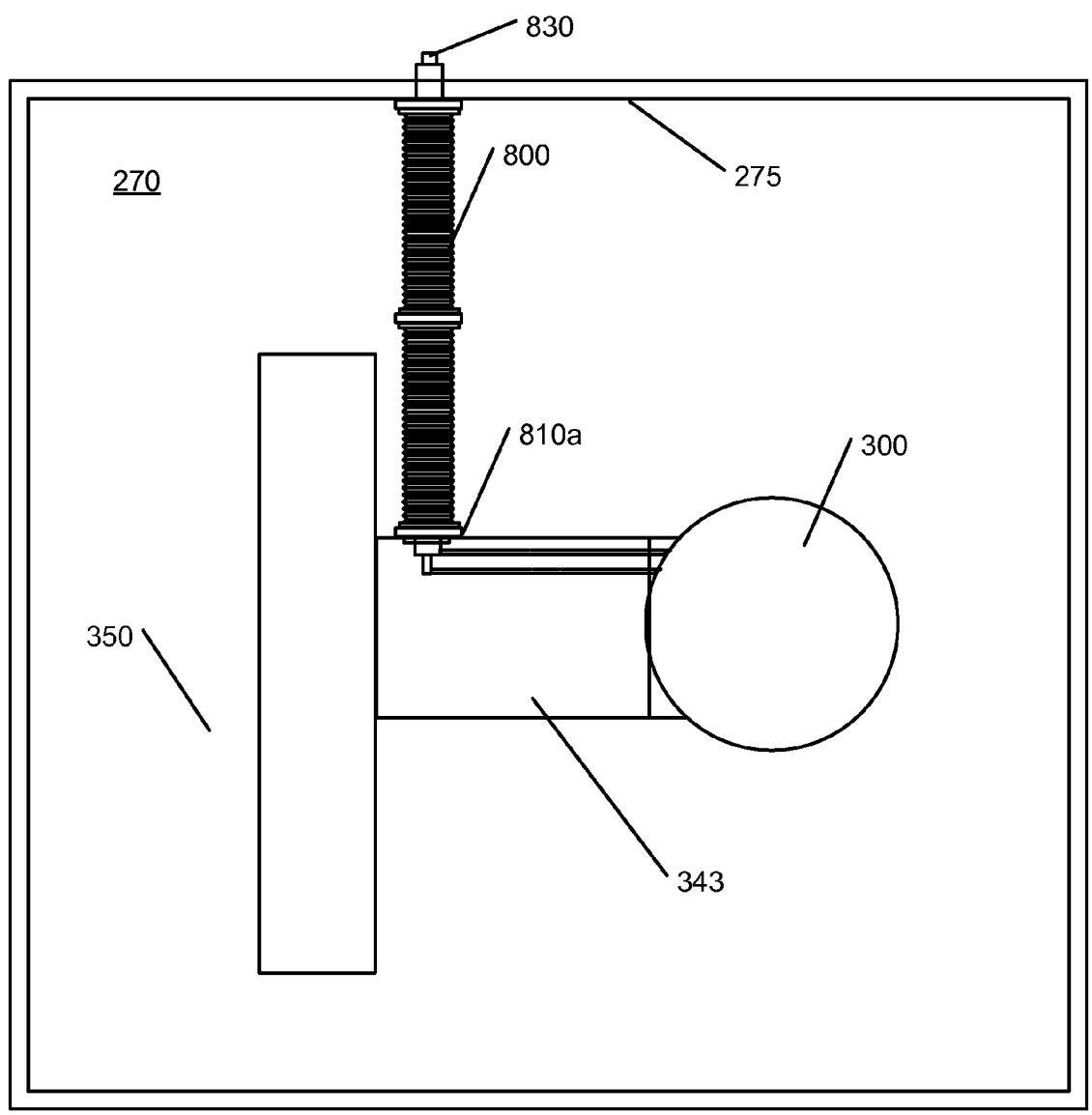
FIG. 10 shows the front view of a process chamber using the embodiment of FIG. 8.

FIG. 10 shows a front view of a process chamber layout using the bellows system of FIGS. 8 and 9. In the embodiment shown, one or more bellows 800 are joined together using couplers 810. The bellows is located within the vacuum environment 270, with one end preferably pressed against the wall 275 of the chamber. In this embodiment, the opposite end of the bellows 800 attached to the workpiece support 350. The central tube 830 is in communication with the movable portion 343 of the workpiece support 350, with its distal end extending outside the vacuum environment 270. The lowest coupler 810a is in communication with the workpiece support 350, and is sealed to form a fluid and airtight seal. As explained in conjunction with FIG. 3, the workpiece support and platen 300 moves in an up and down (vertical) direction. The bellows, being constrained by the chamber wall 275 and the movable portion 343 compresses and expands in response to this movement. As the movable portion 343 moves upward, the central tube 830 simply extends further out into the non-vacuum environment. In this configuration, there is a fluid and airtight seal between the coupler 810 and the tube 830. Thus, the differential pumps described in conjunction with the previous embodiment are not required.

Figure 11A:
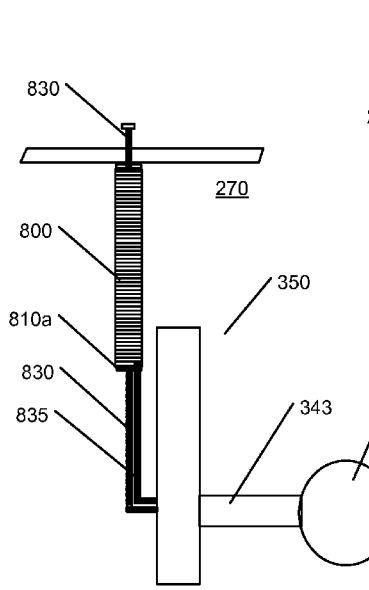
FIG. 11 shows a second embodiment utilizing bellows.
Figure 11B:
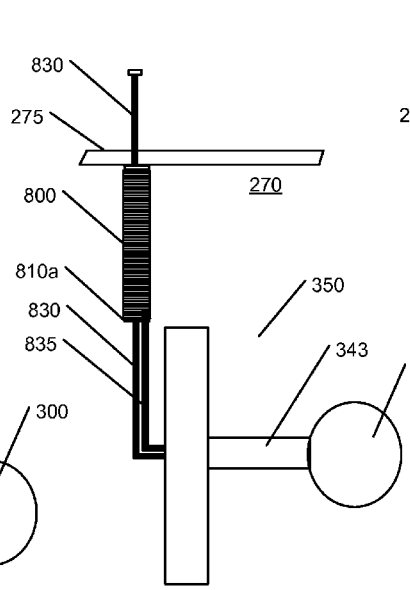
Figure 11C:
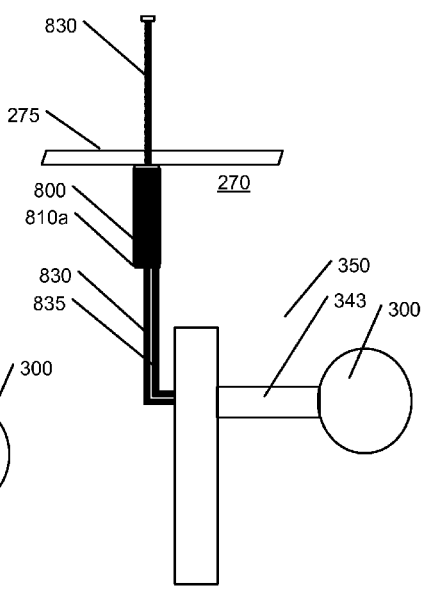

FIGS. 11a-c shows a second embodiment utilizing bellows. In this embodiment, the lowest coupler 810a is not in direct contact with the movable portion 343. Rather, a tube 835 connects the lowest coupler 810a to the movable portion 343. This tube 835 is much shorter than central tube 830. In this embodiment, the bellows 800 is confined between the chamber wall 275 and the end of tube 835. Thus, as the movable portion 343 moves, the tube 835 moves accordingly. This action then causes the bellows to expand or contract as required.

As the wafer is being scanned, the workpiece support 350 moves in the vertical direction. When the platen reaches its lowest point, as shown in FIG. 11a, the bellows 800 is maximally extended. The proximate end of the bellows assembly is in communication, preferably via a fluid and airtight seal, with the wall 275 of the chamber. Thus, as the platen moves downward, the bellows assembly is extended. The central tube 830 moves in accordance with the movable portion 830 and therefore, in this position, the tube is mostly within the vacuum environment 270.

When the platen moves in the upward direction, as shown in FIG. 11b, the bellows 800 begins to compress, and the central tube 830 extends further outside of the vacuum chamber 270.

When the platen reaches its highest point, as shown in FIG. 11c, the central tube 830 is maximally extended out of the vacuum environment 270 and the bellows is maximally compressed.

While the sequence shown in FIG. 11 utilizes a tube 835 to connect the movable portion 343 to the bellows 810, the explanation is equally applicable to the embodiment illustrated in FIG. 10, where the bellows is in direct contact with the movable portion 343.

Figure 12:
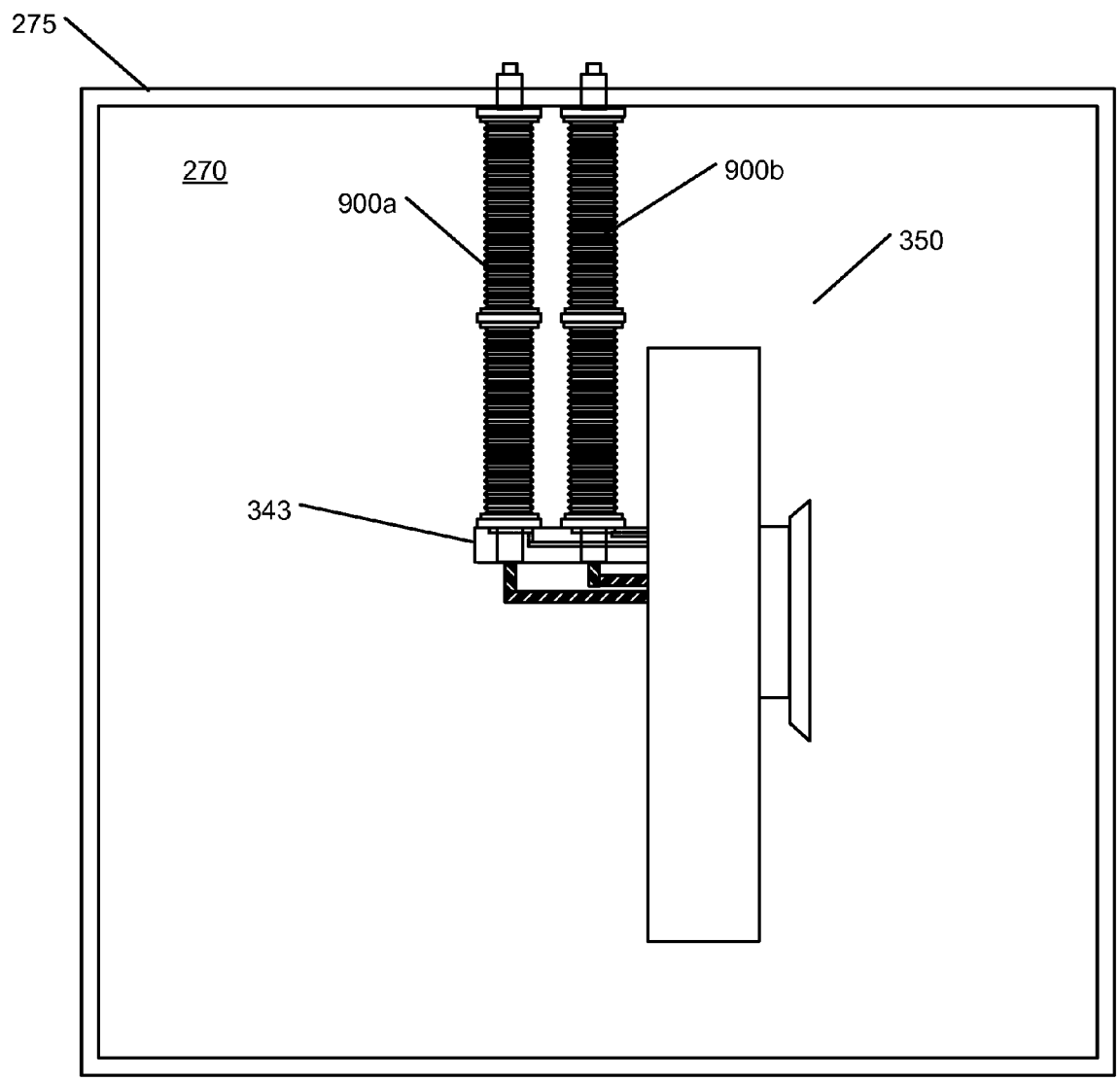
FIG. 12 shows a third embodiment utilizing bellows.

It should be noted that while two fluid paths to the platen, one for supply and one for return are typical, other embodiments are possible. For example, in some applications, it may be necessary to supply backside gas into the vacuum environment. Backside gas refers to a gas injected between the wafer and the platen. This gas is in the cooling path for heat that must be removed from the wafer. The mechanisms described in the present disclosure can be used to provide this gas. For example, FIG. 12 shows an embodiment utilizing 2 bellows assemblies 900a, 900b. The first bellows assembly 900a can be used to provide fluid to the platen as described above. The second bellows assembly can be used to supply a second fluid to the workpiece support. In certain embodiments, this fluid is the backside gas described above. In other embodiments, this fluid may be a second fluid that is passed through the platen. For example, assume the implant process requires that a portion of the ion implantation be performed at a first temperature and a second portion of the implantation be performed at a second temperature, where one of these temperatures is cryogenic. The first bellows assembly 900a may provide the supply and return path for liquid nitrogen (or other cryogenic fluids). This path is enabled while the ion implantation is being performed at low temperature. The second bellows assembly 900b is used to supply a second fluid (such as water or CDA), which is used during the implantation performed at the higher temperature. Valves, such as within the workpiece support 350, can be used to enable the appropriate fluid path. While the delivery of a cryogenic fluid is contemplated, it is not a requirement of the present disclosure. For example, the two fluids may be used for two different temperature ranges, where neither is cryogenic.

Figure 13:
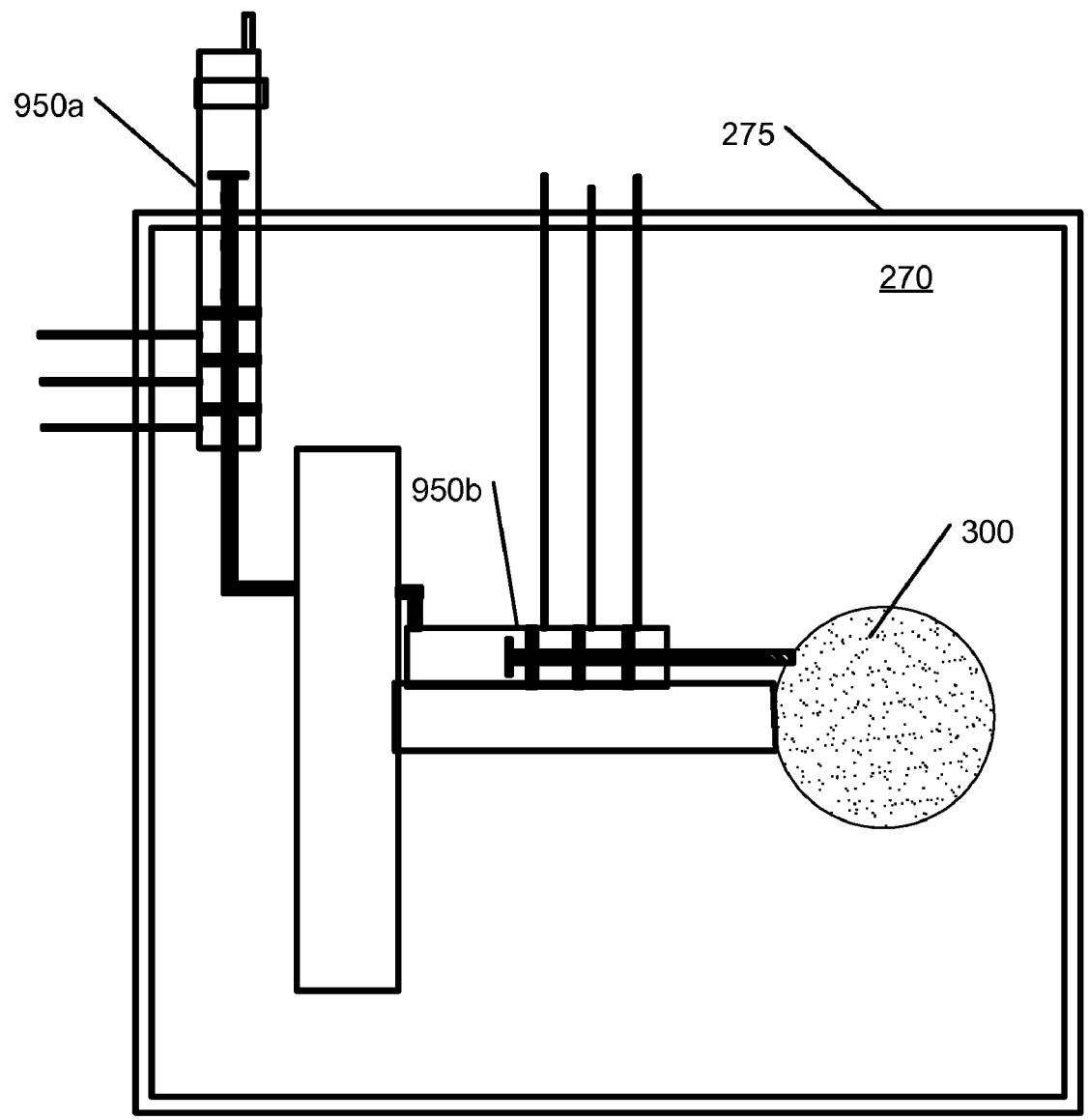
FIG. 13 shows an embodiment that provides movement along two axis.

The previous figures show a fluid delivery mechanism that provides axial movement in one dimension. By combining several of these mechanisms, as shown in FIG. 13, it is possible to achieve movement along two axis. FIG. 13 shows a vacuum chamber 270 that has two fluid delivery mechanisms 950a, 950b. Each can be of either of the embodiments described above, or of another embodiment with the same functionality. The first fluid delivery mechanism 950a is located partly within the vacuum environment 270, as described above. However, instead of connecting to the workpiece support, it is connected to a second fluid delivery mechanism 950b, oriented in a different direction. In the embodiment shown in FIG. 13, the two fluid delivery mechanisms are oriented perpendicular to one another, however, this is not a requirement. In this embodiment, the platen can be moved vertically, as in the previous embodiments. However, the platen can also move horizontally, thereby allowing any desired motion in the x-y plane.

What is claimed is:

1. A mechanism for maintaining a workpiece at a desired temperature, comprising:
   a. a platen upon which said workpiece is positioned, having a conduit therein;
   b. a first fluid delivery mechanism, comprising:
      i. a hollow cylinder having a closed end and an open end;
      ii. a tube, having a proximate end positioned within said cylinder, a distal end extending from said open end of said cylinder, and a first conduit between said proximate and distal ends, wherein said first conduit is in fluid communication with said conduit in said platen;
      iii. a first sealing element located within said cylinder, and positioned between an outer surface of said tube and an inner surface of said cylinder, such that said tube can move relative to said cylinder and said first sealing element and wherein the volume within said cylinder between said closed end and said first sealing element defines a first chamber wherein said proximate end of said tube is located in said first chamber; and
      iv. a fluid passageway in communication with said first chamber and an outer surface of said cylinder, adapted to supply or remove fluid into said first chamber.

2. The mechanism of claim 1, further comprising:
   a. a second sealing element, located within said cylinder between said first sealing element and said open end of said cylinder, and positioned between said outer surface of said tube and said inner surface of said cylinder, such that said tube can move relative to said cylinder and said second sealing element and wherein the volume within said cylinder between said first sealing element and said second sealing element defines a second chamber; and
   b. a differential pump in communication with said second chamber.

3. The mechanism of claim 1, further comprising:
   a. a second sealing element, located within said cylinder between said first sealing element and said open end of said cylinder, and positioned between said outer surface of said tube and said inner surface of said cylinder, such that said tube can move relative to said cylinder and said second sealing element and wherein the volume within said cylinder between said first sealing element and said second sealing element defines a second chamber;
   b. a second conduit in said tube, in fluid communication with said second chamber and said distal end; and
   c. a second fluid passageway in communication with said second chamber and said outer surface of said cylinder adapted to supply or move fluid from said second chamber.

4. The mechanism of claim 3, wherein said conduit in said platen comprises an inlet and an outlet and said first conduit in said tube is in communication with said inlet and said second conduit in said tube is in communication with said outlet.

5. The mechanism of claim 3, wherein said conduit in said platen comprises an inlet and an outlet and said first conduit in said tube is in communication with said outlet and said second conduit in said tube is in communication with said inlet.

6. The mechanism of claim 3, further comprising:
   a. a third sealing element, located within said cylinder between said second sealing element and said open end of said cylinder, and positioned between said outer surface of said tube and said inner surface of said cylinder, such that said tube can move relative to said cylinder and said third sealing element and wherein the volume within said cylinder between said second sealing element and said third sealing element defines a third chamber; and
   b. a differential pump in communication with said third chamber.

7. The mechanism of claim 3, further comprising:
   a. a plurality of sealing elements, located within said cylinder between said second sealing element and said open end of said cylinder, and positioned between said outer surface of said tube and said inner surface of said cylinder, such that said tube can move relative to said cylinder and each of said plurality of sealing elements and wherein said plurality of sealing elements defines a plurality of additional chambers; and
   b. a plurality of differential pumps, each in communication with a respective one of said additional chambers.

8. The mechanism of claim 1, further comprising a second fluid delivery mechanism, comprising:
   a. a second hollow cylinder having a second closed end and a second open end;
   b. a second tube, having a second proximate end positioned within said second cylinder, a second distal end extending from said second open end of said second cylinder, and a second conduit between said second proximate and second distal ends, wherein said second conduit is in fluid communication with said passageway in said first fluid delivery mechanism;
   c. a second sealing element located within said second cylinder, and positioned between an outer surface of said second tube and an inner surface of said second cylinder, such that said second tube can move relative to said second cylinder and said second sealing element and wherein the volume within said second cylinder between said second closed end and said second sealing element defines a second chamber wherein said second proximate end of said second tube is located in said second chamber; and
   d. a second fluid passageway in communication with said second chamber and an outer surface of said second cylinder, adapted to supply or remove fluid into said second chamber.

9. The mechanism of claim 8, wherein said tube and said second tube of said first and second fluid delivery mechanisms are oriented in different directions, so as to provide two degrees of motion.

10. The mechanism of claim 1, further comprising a second fluid delivery mechanism, comprising:
    a. a second hollow cylinder having a second closed end and a second open end;
    b. a second tube, having a second proximate end positioned within said second cylinder, a second distal end extending from said second open end of said second cylinder, and a second conduit between said second proximate end and second distal end, wherein said second conduit is in fluid communication with said conduit in said platen;
    c. a second sealing element located within said second cylinder, and positioned between an outer surface of said second tube and an inner surface of said second cylinder, such that said second tube can move relative to said second cylinder and said second sealing element and wherein the volume within said second cylinder between said second closed end and said second sealing element defines a second chamber wherein said second proximate end of said second tube is located in said second chamber; and
    d. a second fluid passageway in communication with said second chamber and an outer surface of said second cylinder, adapted to supply or remove fluid into said second chamber, and wherein said first and second fluid delivery mechanisms supply different fluids to said platen.

11. A mechanism for maintaining a workpiece at a desired temperature, comprising:
    a. a platen upon which said workpiece is positioned, having a conduit therein;
    b. a first fluid delivery mechanism, comprising:
       i. a bellows having first and second ends;
       ii. couplers, located in each of said ends of said bellows, each having a central passageway; and
       iii. a tube, passing through said central passageways in said couplers and through said bellows, having a proximate end extending from said first end and a distal end extending from said second end of said bellows, and a first conduit between said proximate and distal ends, wherein said first conduit is in fluid communication with said conduit in said platen;
    c. a second fluid delivery system, comprising:
       i. a second bellows having first and second ends;
       ii. second couplers, located in each of said ends of said second bellows, each having a second central passageway; and
       iii. a second tube, passing through said second central passageways in said second couplers and through said second bellows, having a proximate end extending from said first end and a distal end extending from said second end of said second bellows, and a second conduit between said proximate and distal ends of said second tube, wherein said second conduit is in fluid communication with either said conduit in said platen or with said first conduit in said first fluid delivery system.

12. The mechanism of claim 11, wherein said tube and said second tube of said first and second fluid delivery mechanisms are oriented in different directions, so as to provide two degrees of motion.

13. A mechanism for maintaining a workpiece at a desired temperature, comprising:
    a. a platen upon which said workpiece is positioned, having a conduit therein;
    b. a first fluid delivery mechanism, comprising:
       i. a bellows having first and second ends;
       ii. couplers, located in each of said ends of said bellows, each having a central passageway; and
       iii. a tube, passing through said central passageways in said couplers and through said bellows, having a proximate end extending from said first end and a distal end extending from said second end of said bellows, and a first conduit between said proximate and distal ends, wherein said first conduit is in fluid communication with said conduit in said platen;
    c. a second fluid delivery system, comprising:
       i. a hollow cylinder having a closed end and an open end;
       ii. a second tube, having a proximate end positioned within said cylinder, a distal end extending from said open end of said cylinder, and a second conduit between said proximate and distal ends of said second tube, wherein said second conduit is in fluid communication with said first conduit in said first fluid delivery mechanism;
       iii. a sealing element located within said cylinder, and positioned between an outer surface of said second tube and an inner surface of said cylinder, such that said second tube can move relative to said cylinder and said sealing element and wherein the volume within said cylinder between said closed end and said sealing element defines a chamber wherein said proximate end of said second tube is located in said chamber; and
       iv. a fluid passageway in communication with said chamber and an outer surface of said cylinder, adapted to supply or remove fluid into said chamber.

14. The mechanism of claim 13, wherein said tube and said second tube of said first and second fluid delivery mechanisms are oriented in different directions, so as to provide two degrees of motion.

* * * * *